United States Patent
Ogasawara et al.

(10) Patent No.: US 11,404,282 B2
(45) Date of Patent: Aug. 2, 2022

(54) METHOD OF ETCHING FILM AND PLASMA PROCESSING APPARATUS

(71) Applicant: Tokyo Electron Limited, Tokyo (JP)

(72) Inventors: Kosuke Ogasawara, Miyagi (JP); Takahisa Iwasaki, Hillsboro, OR (US); Kentaro Ishii, Miyagi (JP); Seiji Ide, Miyagi (JP); Chiju Hsieh, Hillsboro, OR (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/823,565

(22) Filed: Mar. 19, 2020

(65) Prior Publication Data
US 2020/0303203 A1    Sep. 24, 2020

(30) Foreign Application Priority Data

Mar. 20, 2019 (JP) .............................. JP2019-053348

(51) Int. Cl.
| | | |
|---|---|---|
| *H01L 21/311* | (2006.01) | |
| *H01L 21/3065* | (2006.01) | |
| *H01L 21/3213* | (2006.01) | |
| *H01J 37/32* | (2006.01) | |

(Continued)

(52) U.S. Cl.
CPC .... *H01L 21/31144* (2013.01); *H01J 37/3244* (2013.01); *H01J 37/32082* (2013.01); *H01J 37/32743* (2013.01); *H01L 21/0217* (2013.01); *H01L 21/308* (2013.01); *H01L 21/3065* (2013.01); *H01L 21/30655* (2013.01); *H01L 21/31116* (2013.01); *H01L 21/31138* (2013.01); *H01L 21/32137* (2013.01); *H01L 21/32139* (2013.01)

(58) Field of Classification Search
None
See application file for complete search history.

(56) References Cited

U.S. PATENT DOCUMENTS

| | | | | |
|---|---|---|---|---|
| 5,918,126 A | * | 6/1999 | Fulford, Jr. | ....... H01L 21/32139 438/275 |
| 8,153,527 B2 | * | 4/2012 | Loh | .......... H01G 4/30 438/695 |

(Continued)

FOREIGN PATENT DOCUMENTS

| | | | |
|---|---|---|---|
| JP | 2018-006706 A | | 1/2018 |
| JP | 2018-037453 A | | 3/2018 |
| WO | 2018008640 | * | 1/2018 |

*Primary Examiner* — Stephanie P Duclair
(74) *Attorney, Agent, or Firm* — Pearne & Gordon LLP

(57) ABSTRACT

A method of etching a film of a substrate is provided. The substrate includes an underlying region, the film and a mask. The film is provided on the underlying region. The mask is provided on the film. The method includes performing main etching on the film. The main etching is plasma etching of the film and exposes at least a part of the underlying region. The method further includes forming a protective layer on at least a side wall surface of the mask after the performing of the main etching. A material of the protective layer is different from a material of the film. The method further includes performing over-etching on the film after the forming of the protective layer. The over-etching is plasma etching of the film.

11 Claims, 6 Drawing Sheets

(51) Int. Cl.
*H01L 21/02* (2006.01)
*H01L 21/308* (2006.01)

(56) References Cited

U.S. PATENT DOCUMENTS

| | | | |
|---|---|---|---|
| 2007/0026677 A1* | 2/2007 | Ji | H01L 21/0337 438/689 |
| 2017/0178920 A1* | 6/2017 | Dole | H01L 21/31116 |
| 2018/0047578 A1* | 2/2018 | Morikita | H01L 21/31116 |
| 2019/0252198 A1* | 8/2019 | Morikita | H01L 21/32139 |

* cited by examiner

METHOD OF ETCHING FILM AND PLASMA PROCESSING APPARATUS

CROSS-REFERENCE TO RELATED APPLICATION

This application claims the benefit of Japanese Patent Application No. 2019-053348 filed on Mar. 20, 2019, the entire disclosure of which is incorporated herein by reference.

TECHNICAL FIELD

The exemplary embodiments described herein pertain generally to a method of etching a film and a plasma processing apparatus.

BACKGROUND

In the manufacture of an electronic device, etching is performed to transfer a pattern of a mask onto a film. In this regard, Patent Document 1 and Patent Document 2 describe techniques including plasma etching of an organic film.

According to the technique described in Patent Document 1, an organic film of a substrate is etched by plasma etching to a depth between a surface of the organic film and an underlying region thereof. Then, a silicon oxide film is formed on a surface of the substrate. The silicon oxide film is formed by atomic layer deposition. The plasma etching of the organic film is performed until the underlying region is exposed. According to the technique described in Patent Document 2, plasma etching of an organic film of a substrate is performed alternately with formation of a silicon oxide film on the substrate by atomic layer deposition.

Patent Document 1: Japanese Patent Laid-open Publication No. 2018-006706

Patent Document 2: Japanese Patent Laid-open Publication No. 2018-037453

SUMMARY

In one exemplary embodiment, there is provided a method of etching a film of a substrate. The substrate includes an underlying region, the film and a mask. The film is provided on the underlying region. The mask is provided on the film. The mask is patterned. The method comprises performing main etching on the film. The main etching is plasma etching of the film and exposes at least a part of the underlying region. The method further comprises forming a protective layer on at least a side wall surface of the mask after the performing of the main etching. A material of the protective layer is different from a material of the film. The method further comprises performing over-etching on the film after the forming of the protective layer. The over-etching is plasma etching of the film.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

In the detailed description that follows, exemplary embodiments are described as illustrations only since various changes and modifications will become apparent to those skilled in the art from the following detailed description. The use of the same reference numbers in different figures indicates similar or identical items.

DETAILED DESCRIPTION

Figure 1:
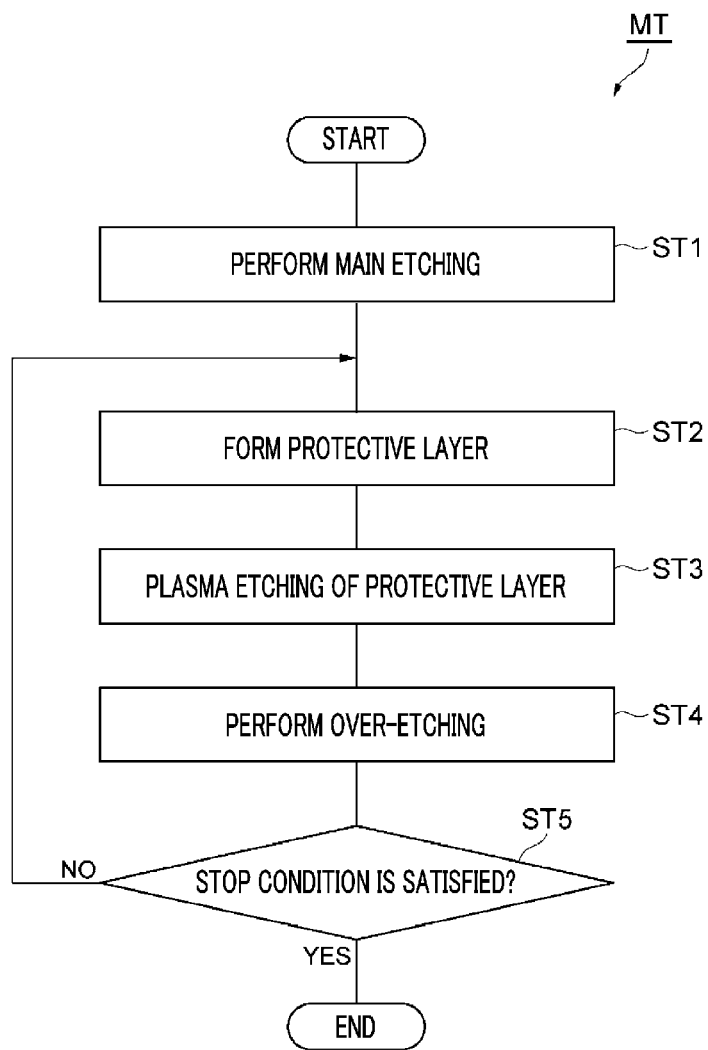
FIG. 1 is a flowchart illustrating a method of etching a film of a substrate according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments of the present disclosure will be described.

In one exemplary embodiment, there is provided a method of etching a film of a substrate. The substrate includes an underlying region, the film and a mask. The film is provided on the underlying region. The mask is provided on the film. The mask is patterned. The method comprises performing main etching on the film. The main etching is plasma etching of the film and exposes at least a part of the underlying region. The method further comprises forming a protective layer on at least a side wall surface of the mask after the performing of the main etching. A material of the protective layer is different from a material of the film. The method further comprises performing over-etching on the film after the forming of the protective layer. The over-etching is plasma etching of the film.

In the above-described method according to the exemplary embodiment, the film is etched by the main etching to expose the underlying region. An opening formed in the film by the main etching has a tapered shape. That is, the width of the opening formed in the film at the bottom thereof is smaller than at the top portion thereof. Then, in this method, the protective layer is formed at least on the side wall surface of the mask. Thereafter, in this method, the over-etching of the film is performed in a state in which the side wall surface of the mask is protected by the protective layer. That is, in this method, the over-etching of the film is performed in a state in which a decrease in the width of the mask is suppressed by the protective layer. Therefore, a decrease in the width of a pattern formed on the film can be suppressed and a verticality of a side wall surface of the film can be improved.

In the exemplary embodiment, the substrate may further include a first region and a second region. A pattern of the mask in the first region may be formed more densely than a pattern of the mask in the second region. According to this method of the exemplary embodiment, the over-etching of the film is performed in the state in which the decrease in the width of the mask is suppressed by the protective layer, and, thus, a difference in shape between the pattern formed on the film in the first region and the pattern formed on the film in the second region can be reduced.

In the exemplary embodiment, the forming of the protective layer and the performing of the over-etching may be repeated alternately.

In the exemplary embodiment, the method may further comprise performing plasma etching after the forming of the protective layer and before the performing of the over-etching. The plasma etching is performed to remove a region of the protective layer formed on a side wall surface of the film which defines the opening formed in the film.

In the exemplary embodiment, a power lever of a bias power in the performing of the plasma etching is higher than a power level of a bias power in each of the performing of the main etching and the performing of the over-etching. The bias power is supplied for attracting ions onto the substrate.

In the exemplary embodiment, the mask may be made of an organic material.

In the exemplary embodiment, the film may be a silicon-containing film.

In the exemplary embodiment, the silicon-containing film may be a silicon nitride film.

In the exemplary embodiment, the substrate may be maintained in a decompressed environment from a start of the performing of the main etching to an end of the performing of the over-etching.

In the exemplary embodiment, the performing of the main etching, the forming of the protective layer and the performing of the over-etching may be performed by using a single plasma processing apparatus.

In the exemplary embodiment, the protective layer may be conformally formed on the substrate. In one exemplary embodiment, the protective layer may be formed by atomic layer deposition.

In another exemplary embodiment, there is provided a plasma processing apparatus. The plasma processing apparatus comprises a chamber, a substrate supporting mechanism, a gas supply, a radio frequency power supply and a controller. The substrate supporting mechanism is provided within the chamber. The gas supply is configured to supply a gas into the chamber. The radio frequency power supply is configured to generate a radio frequency power to form plasma from a gas within the chamber. The controller is configured to control the gas supply and the radio frequency power supply. The controller controls the gas supply and the radio frequency power supply to perform main etching on a film of a substrate. The controller controls the gas supply and the radio frequency power supply to form a protective layer, which is made of a different material from the film, on the substrate after the main etching. The controller controls the gas supply and the radio frequency power supply to perform over-etching on the film of the substrate after the protective layer is formed.

Hereinafter, various exemplary embodiments of the present disclosure will be explained with reference to the accompanying drawings. Further, in the drawings, similar symbols typically identify similar components, unless context dictates otherwise.

Figure 2A:
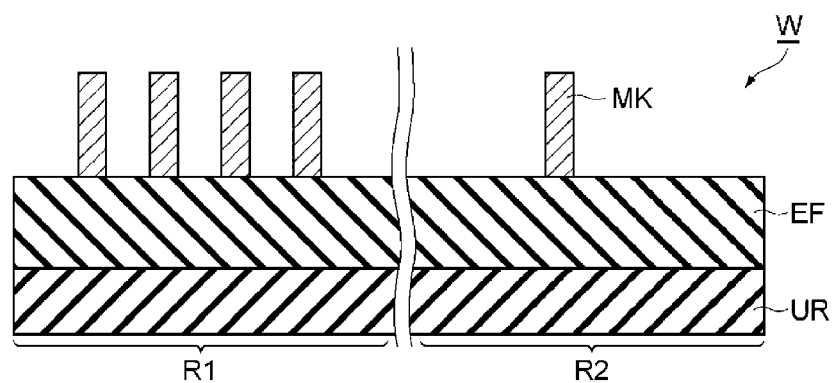
FIG. 2A is a partially enlarged cross-sectional view of an example substrate to which the method illustrated in FIG. 1 is applicable.

FIG. 1 is a flowchart illustrating a method of etching a film of a substrate according to an exemplary embodiment. A method MT illustrated in FIG. 1 is performed to etch a film of a substrate. FIG. 2A is a partially enlarged cross-sectional view of an example substrate to which the method illustrated in FIG. 1 is applicable. A substrate W illustrated in FIG. 2A has an underlying region UR, a film EF and a mask MK.

The film EF is provided on the underlying region UR. The mask MK is provided on the film EF. The mask MK is patterned. That is, the mask MK has a pattern (e.g., line). The mask MK provides a space where the film EF is exposed around the pattern.

In the exemplary embodiment, the substrate W may have a first region R1 and a second region R2. A pattern of the mask MK in the first region R1 may be formed more densely than a pattern of the mask MK in the second region R2. That is, the ratio of the width of the space around the pattern to the width of the pattern of the mask MK in the first region R1 is smaller than in the second region R2. For example, the width of the space around the pattern of the mask MK in the first region R1 is smaller than the width of the space around the pattern of the mask MK in the second region R2.

The film EF is made of a material that is selectively etched with respect to the mask MK. The film EF may be made of a material that is also selectively etched with respect to the underlying region UR. The film EF may be a silicon-containing film or an organic film. Examples of the film EF as the silicon-containing film may include a silicon nitride film or a silicon film (e.g., polycrystalline silicon film). If the film EF is the silicon-containing film, the mask MK may be made of an organic material, amorphous carbon, metal or a metal-containing material. The metal and the metal-containing material may include, e.g., tungsten, tantalum and titanium. The metal-containing material may include a nitride, carbide or oxide of the metal. The underlying region UR may be made of, e.g., a silicon oxide.

Figure 3:
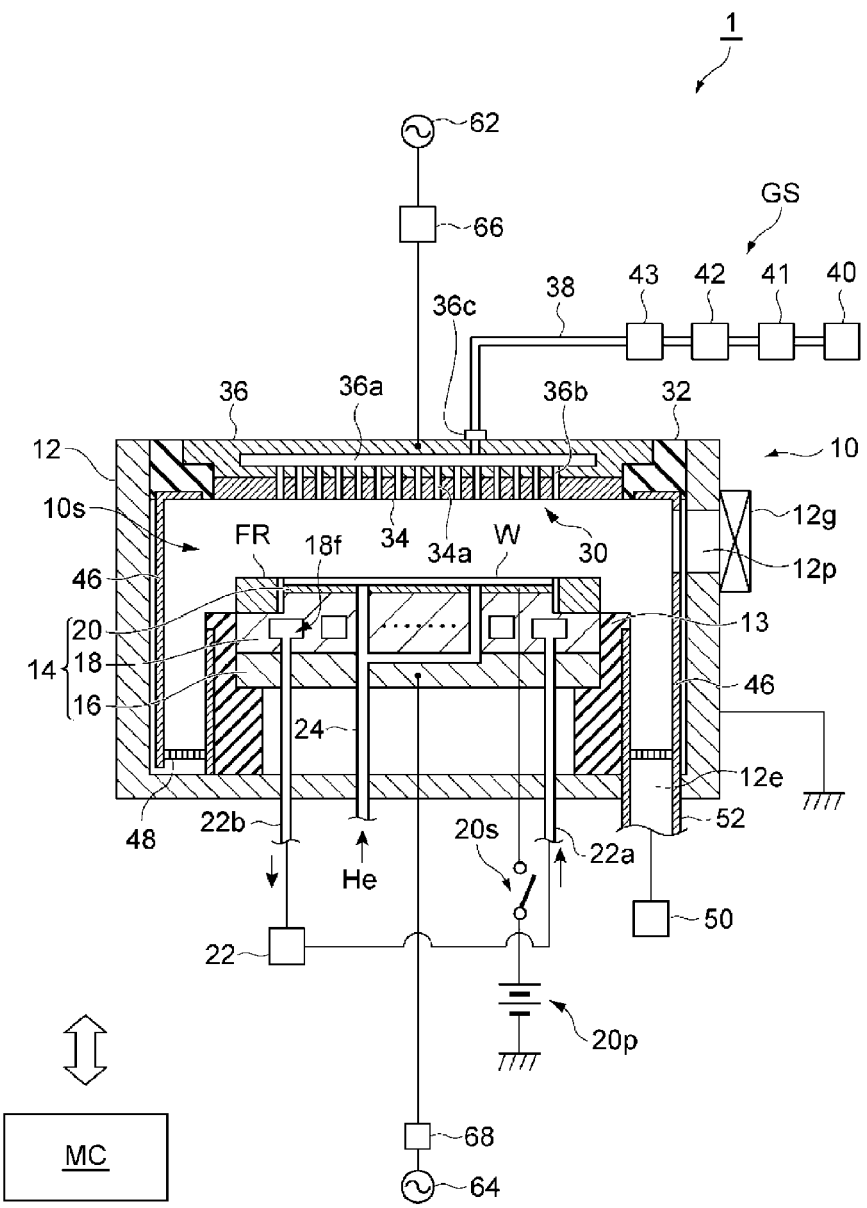
FIG. 3 is a diagram schematically illustrating an example of a plasma processing apparatus which can be used in the method illustrated in FIG. 1.

A plasma processing apparatus is used for performing the method MT. FIG. 3 is a diagram schematically illustrating an example of the plasma processing apparatus which can be used to perform the method illustrated in FIG. 1. A plasma processing apparatus 1 illustrated in FIG. 3 is a capacitively coupled plasma processing apparatus. The plasma processing apparatus 1 is equipped with a chamber 10. The chamber 10 provides an inner space 10s inside the plasma processing apparatus 1.

The chamber 10 includes a chamber main body 12. The chamber main body 12 has a substantially cylindrical shape. The inner space 10s is provided inside the chamber main body 12. The chamber main body 12 is made of a conductor such as aluminum. The chamber main body 12 is grounded. A film having corrosion resistance is formed on an inner wall surface of the chamber main body 12. The film having corrosion resistance may be made of ceramic such as aluminum oxide and yttrium oxide.

A passage 12p is formed at a side wall of the chamber main body 12. When the substrate W is transferred between the inner space 10s and the outside of the chamber 10, the substrate W passes through the passage 12p. This passage 12p can be opened or closed by a gate valve 12g. The gate valve 12g is provided along the side wall of the chamber main body 12.

A support 13 is provided on a bottom portion of the chamber main body 12. The support 13 is made of an insulating material. The support 13 has a substantially cylindrical shape. The support 13 extends upwards from the bottom portion of the chamber main body 12 within the inner space 10s. The support 13 supports a substrate supporting mechanism 14. The substrate supporting mechanism 14 is configured to support the substrate W within the chamber 10, i.e., within the inner space 10s.

The substrate supporting mechanism 14 includes a lower electrode 18 and an electrostatic chuck 20. The lower electrode 18 and the electrostatic chuck 20 are provided within the chamber 10. The substrate supporting mechanism 14 may further include an electrode plate 16. The electrode plate 16 is made of a conductor such as aluminum and has a substantially disk shape. The lower electrode 18 is provided on the electrode plate 16. The lower electrode 18 is made of a conductor such as aluminum and has a substantially disk shape. The lower electrode 18 is electrically connected to the electrode plate 16.

The electrostatic chuck 20 is provided on the lower electrode 18. The substrate W is placed on an upper surface of the electrostatic chuck 20. The electrostatic chuck 20 includes a main body and an electrode. The main body of the electrostatic chuck 20 is made of a dielectric material. The electrode of the electrostatic chuck 20 is a film-shaped electrode and provided within the main body of the electrostatic chuck 20. The electrode of the electrostatic chuck 20 is connected to a DC power supply 20p via a switch 20s. When a voltage is applied from the DC power supply 20p to the electrode of the electrostatic chuck 20, an electrostatic attraction force is generated between the electrostatic chuck 20 and the substrate W. The substrate W is attracted to the electrostatic chuck 20 by the generated electrostatic attraction force and held by the electrostatic chuck 20.

An edge ring FR is placed on the substrate supporting mechanism 14. The edge ring FR may be made of, but not limited to, silicon, silicon carbide or quartz. When the substrate W is processed within the chamber 10, the substrate W is placed on the electrostatic chuck 20 and within a region surrounded by the edge ring FR.

A flow path 18f is provided within the lower electrode 18. A heat exchange medium (e.g., coolant) is supplied into a flow path 18f from a chiller unit 22 through a line 22a. The chiller unit 22 is provided outside the chamber 10. The heat exchange medium supplied into the flow path 18f is returned back to the chiller unit 22 through a line 22b. In the plasma processing apparatus 1, a temperature of the substrate W placed on the electrostatic chuck 20 is controlled by heat exchange between the heat exchange medium and the lower electrode 18. Further, a heater (e.g., resistance heating element) may be provided within the substrate supporting mechanism 14. The temperature of the substrate W may be controlled by the heater.

The plasma processing apparatus 1 may further include a gas supply line 24. The gas supply line 24 supplies a heat transfer gas (e.g., He gas) to a gap between the upper surface of the electrostatic chuck 20 and a rear surface of the substrate W. The heat transfer gas is supplied from a heat transfer gas supply mechanism to the gas supply line 24.

The plasma processing apparatus 1 may further include an upper electrode 30. The upper electrode 30 is provided above the substrate supporting mechanism 14. The upper electrode 30 is supported by an upper portion of the chamber main body 12 via a member 32. The member 32 is made of a material having insulation properties. The upper electrode 30 and the member 32 close an upper opening of the chamber main body 12.

The upper electrode 30 may include a ceiling plate 34 and a supporting body 36. A lower surface of the ceiling plate 34 is on the side of the inner space 10s and defines the inner space 10s. The ceiling plate 34 is made of a silicon-containing material. The ceiling plate 34 is made of, e.g., silicon or silicon carbide. The ceiling plate 34 is provided with a plurality of gas discharge holes 34a. The plurality of gas discharge holes 34a penetrates the ceiling plate 34 in a thickness direction of the ceiling plate 34.

The supporting body 36 detachably supports the ceiling plate 34. The supporting body 36 is made of a conductive material such as aluminum. A gas diffusion space 36a is formed within the supporting body 36. The supporting body 36 is provided with a plurality of gas holes 36b. The plurality of gas holes 36b extends downwards from the gas diffusion space 36a. The plurality of gas holes 36b communicates with the plurality of gas discharge holes 34a, respectively. The supporting body 36 is provided with a gas inlet port 36c. The gas inlet port 36c is connected to the gas diffusion space 36a. A gas supply line 38 is connected to the gas inlet port 36c.

The gas supply line 38 is connected to a gas source group 40 via a valve group 41, a flow rate controller group 42 and a valve group 43. The gas source group 40, the valve group 41, the flow rate controller group 42 and the valve group 43 constitute a gas supply GS. The gas source group 40 includes a plurality of gas sources. The plurality of gas sources of the gas source group 40 includes sources of a plurality of gases used in the method MT. Each of the valve group 41 and the valve group 43 includes a plurality of opening/closing valves. The flow rate controller group 42 includes a plurality of flow rate controllers. Each of the flow rate controllers of the flow rate controller group 42 may be a mass flow controller or a pressure control type flow rate controller. Each of the plurality of gas sources of the gas source group 40 is connected to the gas supply line 38 via a corresponding opening/closing valve belonging to the valve group 41, a corresponding flow rate controller belonging to the flow rate controller group 42 and a corresponding opening/closing valve belonging to the valve group 43.

The plasma processing apparatus 1 includes a shield 46 that is detachably provided along the inner wall surface of the chamber main body 12. The shield 46 is also provided at an outer periphery of the support 13. The shield 46 suppresses a by-product, which has been generated during the plasma processing, from adhering to the chamber main body 12. The shield 46 is prepared by forming a corrosion-resistant film on a surface of a member made of, e.g., aluminum. The corrosion-resistant film may be made of ceramic such as yttrium oxide.

A baffle plate 48 is provided between the support 13 and a side wall of the chamber main body 12. The baffle plate 48 is prepared by forming a corrosion-resistant film on a surface of a member made of, e.g., aluminum. The corrosion-resistant film may be made of ceramic such as yttrium oxide. The baffle plate 48 is provided with a plurality of through-holes. A gas exhaust port 12e is provided under the baffle plate 48 and at the bottom portion of the chamber main body 12. The gas exhaust port 12e is connected to a gas exhaust device 50 via a gas exhaust line 52. The gas exhaust device 50 includes a pressure control valve and a vacuum pump such as a turbo molecular pump.

The plasma processing apparatus 1 further includes a first radio frequency power supply 62 and a second radio frequency power supply 64. The first radio frequency power supply 62 is configured to generate first radio frequency power. In an example, the first radio frequency power has a frequency suitable for plasma formation. The first radio frequency power has a frequency in a range of, e.g., from 27 MHz to 100 MHz. For example, the frequency of the first radio frequency power may be 40 MHz. The first radio frequency power supply 62 is connected to the upper electrode 30 via a matching device 66. The matching device 66 has a circuit configured to match an output impedance of the first radio frequency power supply 62 and an impedance at a load side (upper electrode 30 side). Further, the first radio frequency power supply 62 may be connected to the lower electrode 18 via the matching device 66.

The second radio frequency power supply 64 is configured to generate a second radio frequency power. The second radio frequency power has a lower frequency than that of the first radio frequency power. The second radio frequency power may be used as a radio frequency bias power for ion attraction onto the substrate W. The second radio frequency power has a frequency in a range of, e.g., from 400 kHz to 40.68 MHz. For example, the frequency of the second radio frequency power may be 3.2 MHz. The second radio frequency power supply 64 is connected to the lower electrode 18 via a matching device 68 and the electrode plate 16. The matching device 68 has a circuit configured to match an output impedance of the second radio frequency power supply 64 and an impedance at a load side (lower electrode 18 side).

The plasma processing apparatus 1 further includes a controller MC. The controller MC may be a computer including a processor, a storage such as a memory, an input device, a display device, a signal input/output interface, and the like. The controller MC controls individual components of the plasma processing apparatus 1. An operator may use the input device of the controller MC to perform a command input operation and the like so as to manage the plasma processing apparatus 1. Further, the display device of the controller MC may visualize and display an operation status of the plasma processing apparatus 1. Also, the storage of the controller MC stores a control program and recipe data. The control program is executed by the processor of the controller MC to perform various processings in the plasma processing apparatus 1. When the processor of the controller MC executes the control program and controls individual components of the plasma processing apparatus 1 according to the recipe data, the method MT is performed in the plasma processing apparatus 1.

Figure 2B:
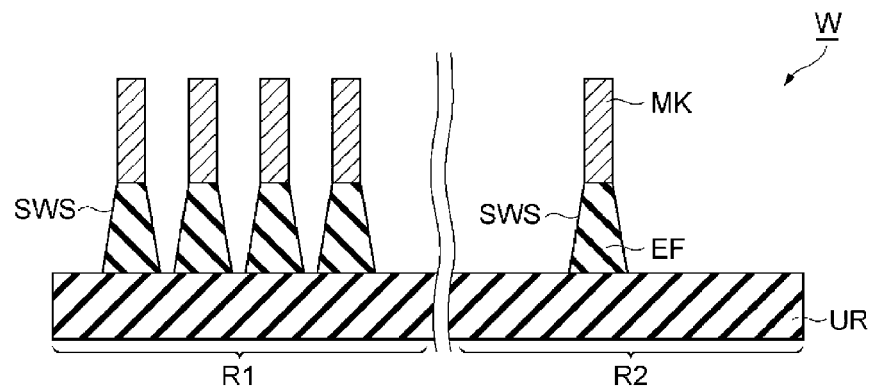
FIG. 2B is a partially enlarged cross-sectional view illustrating a state of the example substrate after a process ST1 is performed.
Figure 4A:
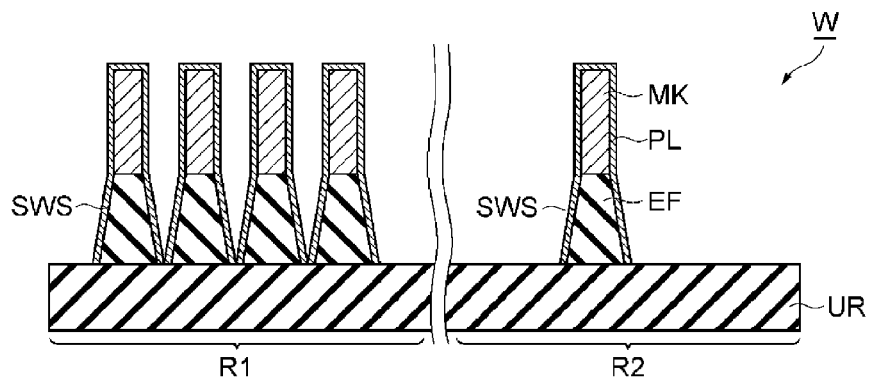
FIG. 4A is a partially enlarged cross-sectional view illustrating a state of the example substrate after a process ST2 is performed.
Figure 4B:
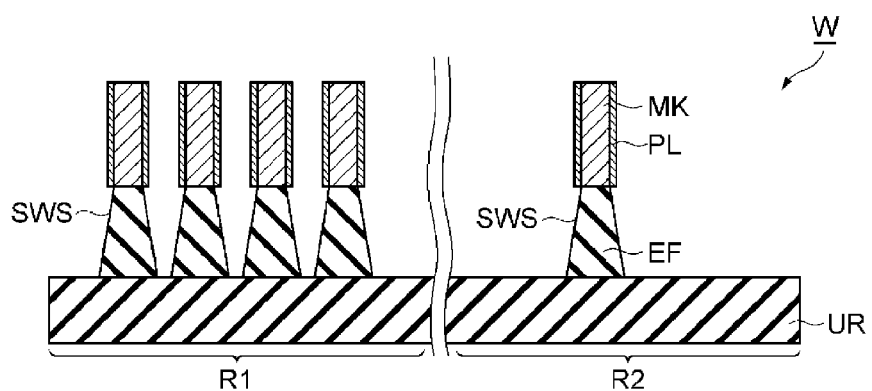
FIG. 4B is a partially enlarged cross-sectional view illustrating a state of the example substrate after a process ST3 is performed and FIG. 4C is a partially enlarged cross-sectional view illustrating a state of the example substrate after a process ST4 is performed.
Figure 4C:
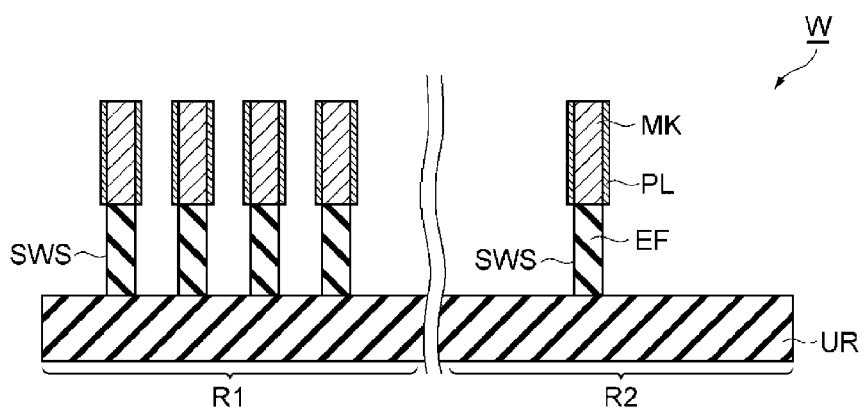

Referring to FIG. 1 again, the method MT will be described in detail. In the following description, the method MT will be explained for an example case where the method MT is performed on the substrate W by using the plasma processing apparatus 1. Further, in the following description, the control of individual components of the plasma processing apparatus 1 by the controller MC will also be described in detail. Furthermore, in the following description, reference is made to FIG. 2B, FIG. 4A, FIG. 4B and FIG. 4C as well as FIG. 1 and FIG. 2A. FIG. 2B is a partially enlarged cross-sectional view illustrating a state of the example substrate after a process ST1 is performed. FIG. 4A is a partially enlarged cross-sectional view illustrating a state of the example substrate after a process ST2 is performed, FIG. 4B is a partially enlarged cross-sectional view illustrating a state of the example substrate after a process ST3 is performed and FIG. 4C is a partially enlarged cross-sectional view illustrating a state of the example substrate after a process ST4 is performed.

As illustrated in FIG. 1, the method MT includes the process ST1, the process ST2 and the process ST4. In an exemplary embodiment, the method MT may further include the process ST3. The process ST3 is performed after the process ST2 is performed and before the process ST4 is performed. In the exemplary embodiment, the substrate W is maintained in a decompressed environment from the start of the process ST1 to the end of the process ST4. That is, the substrate W is not exposed to the atmosphere from the start of the process ST1 to the end of the process ST4. In the exemplary embodiment, the method MT is performed using the single plasma processing apparatus 1. The substrate W is placed within the decompressed inner space 10s of the plasma processing apparatus 1 from the start of the process ST1 to the end of the process ST4.

In the method MT, the substrate W is placed on the substrate supporting mechanism 14. The substrate W is held by the electrostatic chuck 20. In the method MT, the process ST1 is performed first. In the process ST1, main etching is performed on the film EF. The main etching is plasma etching of the film EF and exposes at least a part of the underlying region UR, as illustrated in FIG. 2B.

In the process ST1, plasma is formed from a processing gas within the chamber 10 to etch the film EF. The film EF is etched by chemical species in the formed plasma. If the film EF is a silicon nitride film, the processing gas used in the process ST1 includes a hydrofluorocarbon gas (e.g., $CH_3F$). If the film EF is a silicon film, the processing gas used in the process ST1 includes a halogen-containing gas. The halogen-containing gas is, for example, a HBr gas and/or a $Cl_2$ gas. If the film EF is an organic film, the processing gas used in the process ST1 is, for example, an oxygen-containing gas. The oxygen-containing gas is an oxygen gas ($O_2$ gas), a carbon monoxide gas, a carbon dioxide gas or a mixed gas of two or more of these gases. If the film EF is the organic film, the processing gas used in the process ST1 may be a mixed gas of a nitrogen gas ($N_2$ gas) and a hydrogen gas ($H_2$ gas).

To perform the process ST1, the controller MC controls the gas supply GS to supply the processing gas into the chamber 10. To perform the process ST1, the controller MC controls the gas exhaust device 50 to control the pressure inside the chamber 10 to a predetermined level. To perform the process ST1, the controller MC controls the first radio frequency power supply 62 to supply the first radio frequency power. Further, to perform the process ST1, the controller MC controls the second radio frequency power supply 64 to supply the second radio frequency power.

As illustrated in FIG. 2B, an opening formed in the film EF by the main etching in the process ST1 has a tapered shape. That is, the width of the opening formed in the film EF by the main etching in the process ST1 in the bottom portion thereof is smaller than that in the top portion thereof.

Then, in the method MT, the process ST2 is performed. The process ST2 is performed after the process ST1. In the process ST2, a protective layer PL is formed on at least a side wall surface of the mask MK. In the process ST2 according to the exemplary embodiment, the protective layer PL may be conformally formed on the substrate W, as illustrated in FIG. 4A. A material of the protective layer PL may be different from the material of the film EF. The material of the protective layer PL is, for example, silicon oxide. To form the protective layer PL in the process ST2, the controller MC controls the gas supply GS and at least one of the first radio frequency power supply 62 and the second radio frequency power supply 64.

Figure 5:
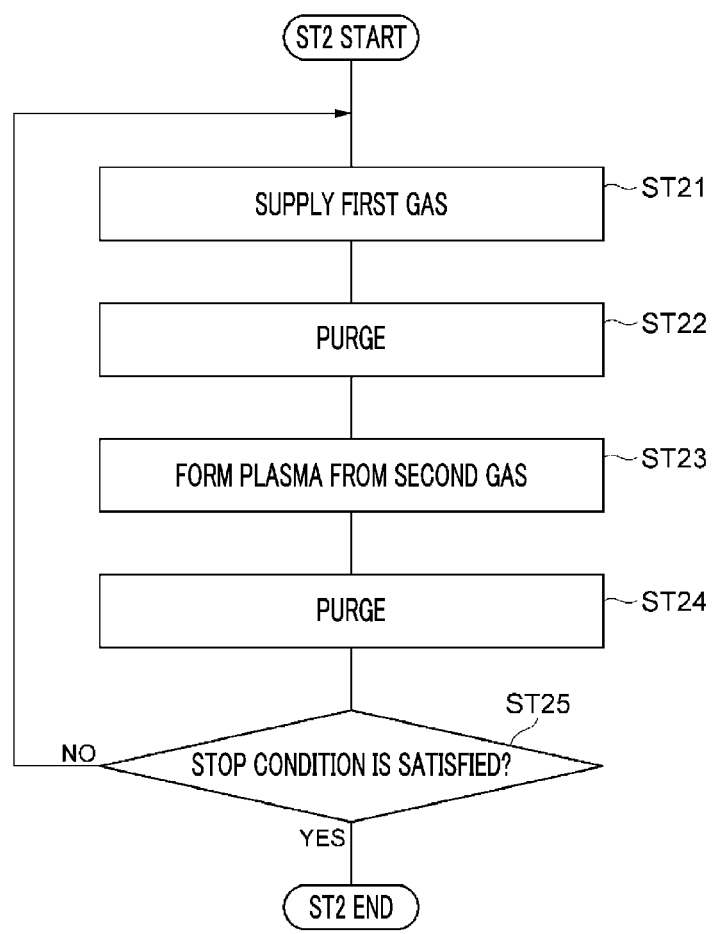
FIG. 5 is a flowchart illustrating an example of the process ST2 in the method illustrated in FIG. 1.

A method of forming the protective layer PL is not limited, but may be, for example, atomic layer deposition. The atomic layer deposition may be performed to uniformly form the protective layer PL on both the first region R1 and the second region R2. FIG. 5 is a flowchart illustrating an example of the process ST2 in the method illustrated in FIG. 1. In the example illustrated in FIG. 5, the process ST2 includes a process ST21 and a process ST23. The process ST2 may further include a process ST22 and a process ST24.

In the process ST21, a first gas is supplied to the substrate W. The first gas contains a precursor gas. The first gas may further contain a carrier gas such as an inert gas. The precursor gas may be an aminosilane-based gas. As the aminosilane-based gas, a gas having a molecular structure with a relatively small number of amino groups may be used. For example, monoaminosilane ($H_3$—Si—R (R is an amino group, which may contain an organic group and may be substituted) may be used as the aminosilane-based gas. The aminosilane-based gas may include aminosilane, which may have one to three silicon atoms, or may include aminosilane having one to three amino groups. The aminosilane having one to three silicon atoms may be monosilane (monoaminosilane) having one to three amino groups, disilane having one to three amino groups or trisilane having one to three amino groups. Further, the aminosilane may have an amino group which may be substituted. Furthermore, the amino group may be substituted by any one of a methyl group, an ethyl group, a propyl group and a butyl group. Moreover, the methyl group, the ethyl group, the propyl group or the butyl group may be substituted by halogen.

To perform the process ST21, the controller MC controls the gas supply GS to supply the first gas into the chamber 10. To perform the process ST21, the controller MC controls the gas exhaust device 50 to control the pressure inside the chamber 10 to a predetermined level. In the process ST21 according to the exemplary embodiment, the plasma may not be formed. Therefore, in the process ST21 according to an exemplary embodiment, the first radio frequency power and the second radio frequency power may not be supplied.

In the process ST21, molecules contained in the first gas adhere as a reaction precursor onto the surface of the substrate W. The molecules contained in the first gas adhere onto the surface of the substrate W by chemical adsorption based on chemical bonding.

The process ST22 is performed between the process ST21 and the process ST23. In the process ST22, the inner space 10s is purged. That is, the first gas inside the chamber 10 is exhausted. In the process ST22, an inert gas may be supplied into the chamber 10. To perform the process ST22, the controller MC operates the gas exhaust device 50. To perform the process ST22, the controller MC may control the gas supply GS to supply the inert gas into the chamber 10. In the process ST22, molecules excessively adhering onto the substrate W are removed.

In the subsequent process ST23, plasma is formed from a second gas within the chamber 10. The second gas contains an oxygen-containing gas. The oxygen-containing gas is, for example, an oxygen gas ($O_2$ gas), a carbon monoxide gas, a carbon dioxide gas or a mixed gas of two or more of these gases. In the process ST2, a monolayer of silicon oxide is formed by a reaction between chemical species in the plasma and the reaction precursor.

To perform the process ST23, the controller MC controls the gas supply GS to supply the second gas into the chamber 10. To perform the process ST23, the controller MC controls the gas exhaust device 50 to control the pressure inside the chamber 10 to a predetermined level. To perform the process ST23, the controller MC controls the first radio frequency power supply 62 to supply the first radio frequency power. Otherwise or in addition, to perform the process ST23, the controller MC controls the second radio frequency power supply 64 to supply the second radio frequency power.

The process ST24 is performed after the process ST23. The process ST24 is the same as the process ST22.

A sequence including the process ST21 and the process ST23 or the processes ST21 to ST24 is performed one or more times based on a required thickness of the protective layer PL. If the sequence is performed a plurality of times, i.e., if the sequence is repeated, the process ST2 further includes a process ST25. In the process ST25, it is determined whether a stop condition is satisfied. The stop condition is satisfied when a repetition number of the sequence reaches a predetermined number of times. If it is determined in the process ST25 that the stop condition is not satisfied, the sequence is performed again. Meanwhile, if it is determined in the process ST25 that the stop condition is satisfied, the process ST2 is ended.

As described above, the process ST3 is performed after the process ST2 is performed and before the process ST4 is performed. Further, after the process ST2, the process ST3 may not be performed, but the process ST4 may be performed.

In the process ST3, plasma etching is performed. The plasma etching in the process ST3 is performed to remove a region of the protective layer PL formed on a side wall surface SWS. The side wall surface SWS refers to a side wall surface of the film EF and defines the opening formed by the main etching in the process ST1. In the process ST3, plasma is formed from a processing gas within the chamber 10. The processing gas includes, for example, a fluorocarbon gas (e.g., $CF_4$ gas). The processing gas may further include an inert gas. The inert gas may be a rare gas such as an argon gas.

In the process ST3, the protective layer PL is partially removed by active species in the formed plasma. The plasma etching in the process ST3 is anisotropic etching in which a region of the protective layer PL extending from a vertical surface (e.g., side wall surface of the mask MK) remains and the other region of the protective layer PL is etched. Specifically, as illustrated in FIG. 4B, a region of the protective layer PL formed on an upper surface of the mask MK and extending along the side wall surface SWS of the film EF is removed by the plasma etching in the process ST3.

To perform the process ST3, the controller MC controls the gas supply GS to supply the processing gas into the chamber 10. To perform the process ST3, the controller MC controls the gas exhaust device 50 to control the pressure inside the chamber 10 to a predetermined level. To perform the process ST3, the controller MC controls the first radio frequency power supply 62 to supply the first radio frequency power. To perform the process ST3, the controller MC controls the second radio frequency power supply 64 to supply the second radio frequency power.

In the exemplary embodiment, the bias power, i.e., the second radio frequency power, supplied in the process ST3 may have a higher power level than the second radio frequency power supplied in the process ST1 and the process ST4. According to this exemplary embodiment, it is possible to efficiently remove the region of the protective layer PL extending along the side wall surface SWS of the film EF by improving the anisotropy of the plasma etching in the process ST3.

The process ST4 is performed after the process ST2 or the process ST3. In the process ST4, over-etching of the film EF is performed. The over-etching is plasma etching of the film EF. The over-etching corrects the shape of the side wall surface SWS of the film EF to improve the verticality thereof, as illustrated in FIG. 4C.

In the process ST4, to perform the over-etching on the film EF, plasma is formed from a processing gas within the chamber 10. The film EF is etched by chemical species in the formed plasma. In the process ST4, the same processing gas as used in the process ST1 may be used. If the film EF is the silicon nitride film, the processing gas used in the process ST4 includes a hydrofluorocarbon gas (e.g., $CH_3F$). If the film EF is the silicon film, the processing gas used in the process ST4 includes a halogen-containing gas. The halogen-containing gas is, for example, a HBr gas and/or a $Cl_2$ gas. If the film EF is the organic film, the processing gas used in the process ST4 is, for example, an oxygen-containing gas. The oxygen-containing gas is an oxygen gas ($O_2$ gas), a carbon monoxide gas, a carbon dioxide gas or a mixed gas of two or more of these gases. If the film EF is the organic film, the processing gas used in the process ST4 may be a mixed gas of a nitrogen gas ($N_2$ gas) and a hydrogen gas ($H_2$ gas).

To perform the process ST4, the controller MC controls the gas supply GS to supply the processing gas into the chamber 10. To perform the process ST4, the controller MC controls the gas exhaust device 50 to control the pressure inside the chamber 10 to a predetermined level. To perform the process ST4, the controller MC controls the first radio frequency power supply 62 to supply the first radio frequency power. Further, to perform the process ST4, the controller MC controls the second radio frequency power supply 64 to supply the second radio frequency power.

In the exemplary embodiment, a sequence including the processes ST2 to ST4 may be performed one or more times. That is, the process ST2 and the process ST4 may be repeated alternately. If the sequence is performed a plurality of times, i.e., if the sequence is repeated, the method MT includes a process ST5. In the process ST5, it is determined whether a stop condition is satisfied. The stop conditions is satisfied when a repetition number of the sequence reaches a predetermined number of times. If it is determined in the process ST5 that the stop condition is not satisfied, the sequence is performed again. Meanwhile, if it is determined in the process ST5 that the stop condition is satisfied, the method MT is ended.

In the method MT, after the main etching of the film EF is performed in the process ST1, the protective layer PL is formed on at least the side wall surface of the mask MK. Then, in the method MT, the over-etching of the film EF is performed in a state in which the side wall surface of the mask MK is protected by the protective layer PL. That is, in the method MT, the over-etching of the film EF is performed in a state in which a decrease in the width of the mask MK is suppressed by the protective layer PL. Therefore, a decrease in the width of the pattern formed on the film EF can be suppressed and the verticality of the side wall surface of the film EF can be improved.

In the exemplary embodiment, the substrate W has the above-described first region R1 and second region R2. In the method MT, the over-etching of the film EF is performed in a state in which the decrease in the width of the mask MK is suppressed by the protective layer PL. Therefore, according to the method MT, a difference in shape between the pattern formed on the film EF in the first region R1 and the pattern formed on the film EF in the second region R2 can be reduced.

Figure 6:
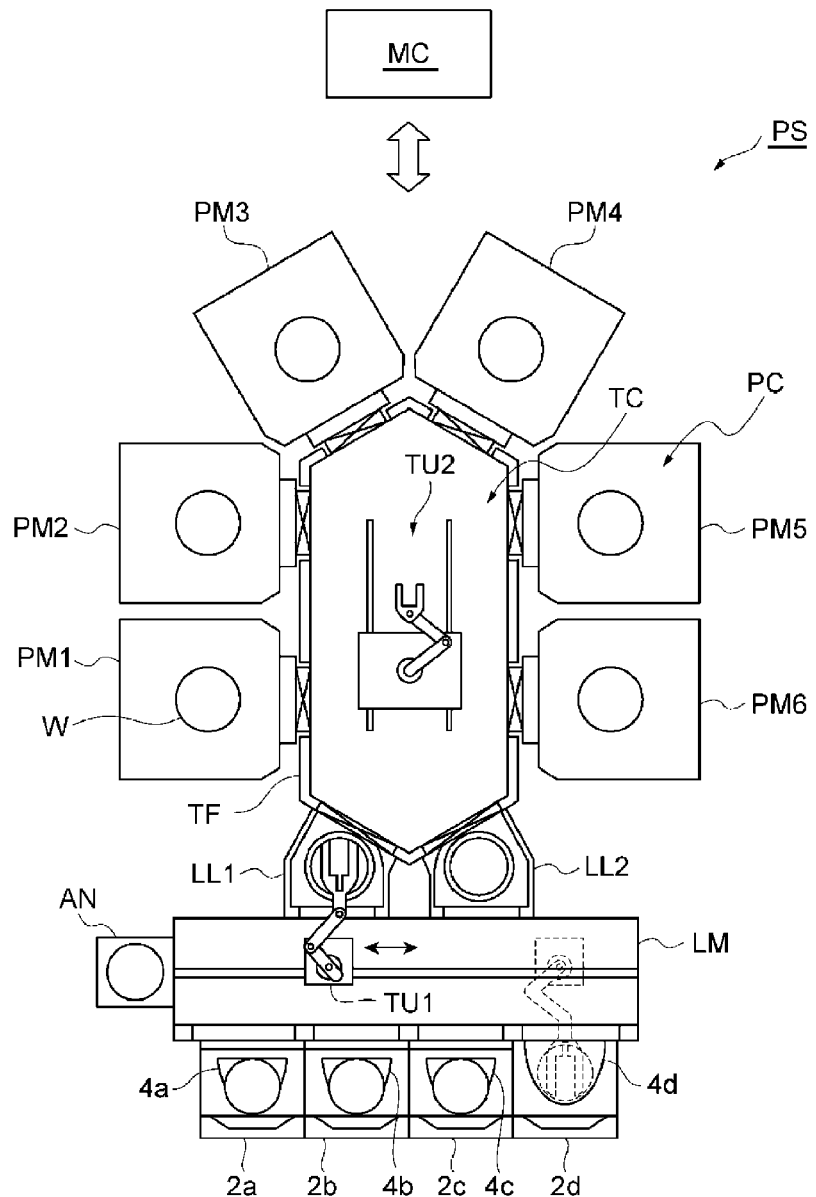
FIG. 6 is a diagram schematically illustrating an example of a processing system which can be used in the method illustrated in FIG. 1.

Hereinafter, reference is made to FIG. 6. FIG. 6 is a diagram schematically illustrating an example of a processing system which can be used in the method illustrated in FIG. 1. At least one of the processes ST1 to ST4 of the method MT may be performed using an apparatus different from apparatuses used in the other processes. Otherwise, each of the processes ST1 to ST4 may be performed using a different apparatus. In this case, a processing system PS illustrated in FIG. 6 may be used to perform the method MT.

The processing system PS illustrated in FIG. 6 includes tables 2a to 2d, containers 4a to 4d, a loader module LM, an aligner AN, load lock modules LL1 and LL2, process modules PM1 to PM6, a transfer module TF and the controller MC. Further, in the processing system PS, the number of tables, the number of containers and the number of load lock modules may be any number equal to or more than two. Also, the number of process modules may be any number equal to or more than two.

The tables 2a to 2d are arranged along an edge of the loader module LM. The containers 4a to 4d are mounted on the tables 2a to 2d, respectively. Each of the containers 4a to 4d is, for example, a container called a Front Opening Unified Pod (FOUP). Each of the containers 4a to 4d is configured to accommodate substrates W therein.

The loader module LM has a chamber therein. The pressure inside the chamber of the loader module LM is set to an atmospheric pressure. A transfer device TU1 is provided within the chamber of the loader module LM. The transfer device TU1 is, for example, a multi-joint robot and controlled by the controller MC. The transfer device TU1 is configured to transfer the substrates W between each of the containers 4a to 4d and the aligner AN, between the aligner AN and each of the load lock modules LL1 and LL2 and between each of the load lock modules LL1 and LL2 and each of the containers 4a to 4d. The aligner AN is connected to the loader module LM. The aligner AN is configured to perform position adjustment (position correction) of the substrate W.

The load lock module LL1 and the load lock module LL2 are provided between the loader module LM and the transfer module TF. Each of the load lock module LL1 and the load lock module LL2 provides a preliminary decompression room.

The transfer module TF is connected to the load lock module LL1 and the load lock module LL2 via respective gate valves. The transfer module TF has a transfer chamber TC that can be decompressed. A transfer device TU2 is provided within the transfer chamber TC. The transfer device TU2 is, for example, a multi-joint robot and controlled by the controller MC. The transfer device TU2 is configured to transfer substrates W between each of the load lock modules LL1 and LL2 and each of the process modules PM1 to PM6 and between any two of the process modules PM1 to PM6.

Each of the process modules PM1 to PM6 is a processing apparatus configured to perform a preset substrate processing. One or more of the process modules PM1 to PM6 may be plasma processing apparatuses like the plasma processing apparatus 1. The process ST1, the process ST3 and the process ST4 may be performed using one or more process modules that function as the plasma processing apparatuses. The others of the process modules PM1 to PM6 may be film forming apparatuses used in the process ST2.

In the processing system PS, the controller MC is configured to control individual components of the processing system PS. The processing system PS can transfer the substrates W between the process modules without exposing the substrates W to the atmosphere. Therefore, in the processing system PS, the method MT can be performed from the start of the process ST1 to the end of the process ST4 without exposing the substrate W to the atmosphere.

While various exemplary embodiments have been described above, various omissions, substitutions, and changes may be made without being limited to the above-described exemplary embodiments. Further, other exemplary embodiments can be implemented by combining elements in different exemplary embodiments.

By way of example, the method MT may be performed by using a plasma processing apparatus other than the capacitively coupled plasma processing apparatus. For example, a plasma processing apparatus used for performing the method MT may be an inductively coupled plasma processing apparatus or a plasma processing apparatus configured to form plasma by a surface wave such as microwave.

According to the exemplary embodiments, when the film of the substrate is etched, it is possible to suppress the decrease in the width of the pattern formed on the film and improve the verticality of a side wall surface of the film.

From the foregoing, it will be appreciated that various exemplary embodiments of the present disclosure have been described herein for purposes of illustration and various changes can be made without departing from the scope and spirit of the present disclosure. Accordingly, various exemplary embodiments described herein are not intended to be limiting, and the true scope and spirit are indicated by the following claims.

We claim:

1. A method of etching a film of a substrate,
   wherein the substrate includes an underlying region, the film provided on the underlying region and a mask provided on the film, and the mask is patterned, and
   wherein the method comprises:
   performing a main etching on the film, the main etching being a plasma etching on the film, exposing at least a part of the underlying region, and forming a side wall surface in a tapered shape on the film;
   forming a protective layer on at least a side wall surface of the mask and on the side wall surface of the film after the performing of the main etching, a material of the protective layer being different from a material of the film;
   removing a portion of the protective layer formed on the side wall surface of the film while remaining a portion of the protective layer formed on the side wall surface of the mask; and
   performing an over-etching on the film after the forming of the protective layer, the over-etching being a plasma etching on the film,
   wherein the substrate further includes a first region and a second region, and
   a pattern of the mask in the first region is formed more densely than a pattern of the mask in the second region.

2. The method of claim 1,
   wherein the side wall surface of the film having the tapered shape defines an opening, and
   the over-etching corrects a shape of the side wall surface of the film, which defines the opening, to improve a verticality thereof.

3. The method of claim 1,
   wherein the forming of the protective layer and the performing of the over-etching are repeated alternately.

4. The method of claim 1,
   wherein a power level of a bias power for ion attraction onto the substrate in the removing of the portion of the protective layer is higher than a power level of a bias power for ion attraction onto the substrate in each of the performing of the main etching and the performing of the over-etching.

5. The method of claim 1,
   wherein the mask is made of an organic material.

6. The method of claim 1,
   wherein the film is a silicon-containing film.

7. The method of claim 6,
   wherein the silicon-containing film is a silicon nitride film.

8. The method of claim 1,
   wherein the substrate is maintained in a decompressed environment from a start of the performing of the main etching to an end of the performing of the over-etching.

9. The method of claim 8,
   wherein the performing of the main etching, the forming of the protective layer and the performing of the over-etching are performed by using a single plasma processing apparatus.

10. The method of claim 1,
    wherein the protective layer is conformally formed on the substrate.

11. The method of claim 10,
    wherein the protective layer is formed by atomic layer deposition.

* * * * *